(12) United States Patent
Huang et al.

(10) Patent No.: US 8,471,753 B1
(45) Date of Patent: Jun. 25, 2013

(54) PIPELINED ANALOG-TO-DIGITAL CONVERTER AND METHOD FOR CONVERTING ANALOG SIGNAL TO DIGITAL SIGNAL

(75) Inventors: Yen-Chuan Huang, Miaoli (TW); Tai-Cheng Lee, Kaohsiung (TW)

(73) Assignees: Mediatek Inc., Hsin-Chu (TW); National Taiwan University, Taipei (TW)

( * ) Notice: Subject to any disclaimer, the term of this patent is extended or adjusted under 35 U.S.C. 154(b) by 224 days.

(21) Appl. No.: 13/034,813

(22) Filed: Feb. 25, 2011

Related U.S. Application Data

(63) Continuation of application No. 12/862,185, filed on Aug. 24, 2010, now abandoned.

(51) Int. Cl.
*H03M 1/38* (2006.01)
(52) U.S. Cl.
USPC .......................................... 341/161; 341/155
(58) Field of Classification Search
USPC ................................................. 341/155, 161
See application file for complete search history.

(56) References Cited

U.S. PATENT DOCUMENTS

| | | | |
|---|---|---|---|
| 5,635,937 A * | 6/1997 | Lim et al. | 341/161 |
| 6,295,016 B1 * | 9/2001 | Chiang | 341/161 |
| 6,323,800 B1 * | 11/2001 | Chiang | 341/161 |
| 7,009,549 B1 * | 3/2006 | Corsi | 341/161 |
| 7,158,066 B2 * | 1/2007 | Lee | 341/144 |
| 2006/0145908 A1 * | 7/2006 | Lee | 341/161 |
| 2006/0187108 A1 * | 8/2006 | Moon | 341/161 |
| 2008/0129567 A1 * | 6/2008 | Lee et al. | 341/155 |

OTHER PUBLICATIONS

Huang, et al.; "A 10b 100MS/s 4.5mW Pipelined ADC with a Time Sharing Technique;" ISSCC 2010; Session 16; High-Performance Data Converters; 16.5, ISSCC 2010, Feb. 9, 2010.

* cited by examiner

*Primary Examiner* — Jean B Jeanglaude
(74) *Attorney, Agent, or Firm* — McClure, Qualey & Rodack, LLP

(57) ABSTRACT

A pipelined analog-to-digital converter with less power consumption is provided. In one embodiment, the pipelined analog-to-digital converter comprises a first stage, a second stage, and a third stage. The first stage receives a first stage input signal to derive a first stage output signal and a first residue. The second stage receives a second stage input signal to derive a second stage output signal and a second residue, wherein the second stage input signal corresponds to the first residue. The third stage receives a third stage input signal to derive a third stage output signal and a third residue, wherein the third stage input signal corresponds to the second residue. The first, second and third stages share an operational amplifier by utilizing at least three phases to control the operational amplifier.

17 Claims, 9 Drawing Sheets

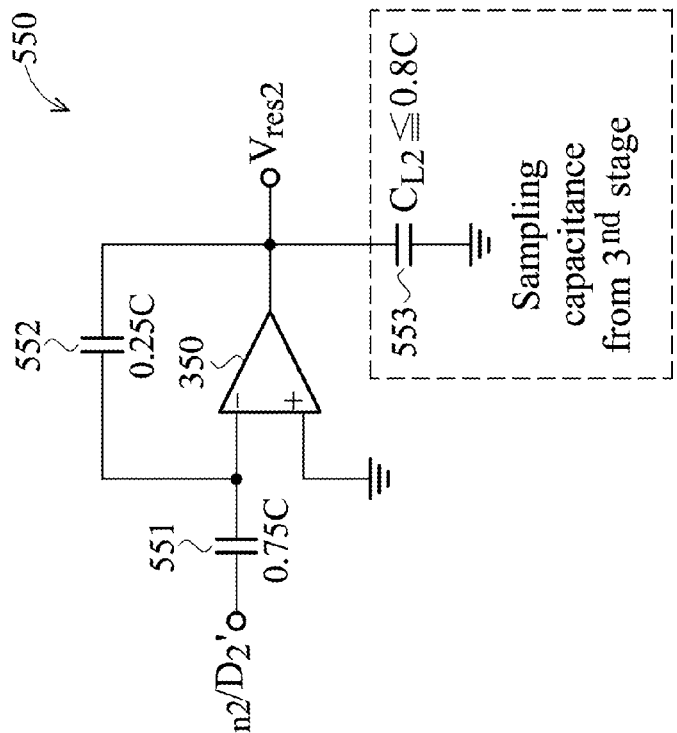
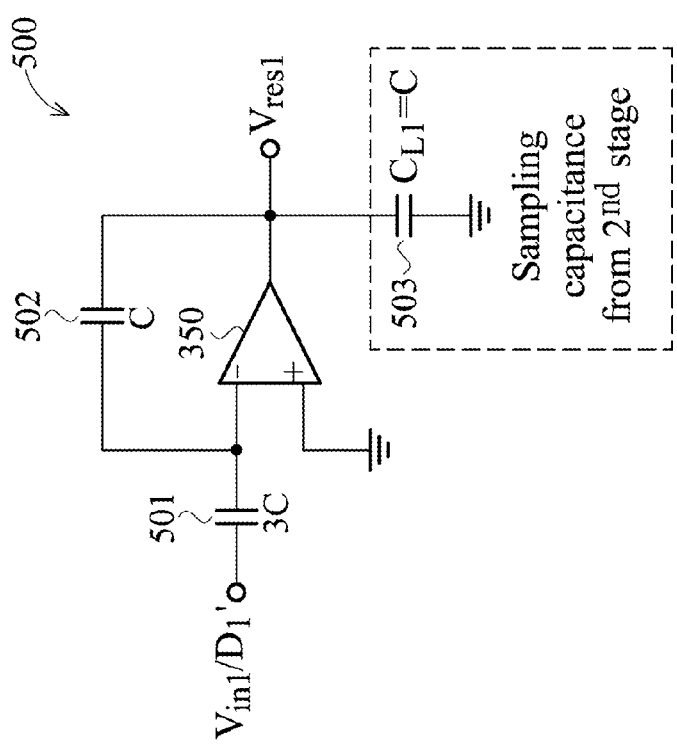
FIG. 5B
FIG. 5A

PIPELINED ANALOG-TO-DIGITAL CONVERTER AND METHOD FOR CONVERTING ANALOG SIGNAL TO DIGITAL SIGNAL

CROSS REFERENCE TO RELATED APPLICATIONS

This application is a Continuation of application Ser. No. 12/862,185, filed Aug. 24, 2010, the entirety of which is incorporated by reference herein.

BACKGROUND OF THE INVENTION

1. Field of the Invention

The invention relates to pipelined analog-to-digital converter (ADC), and more particularly to pipelined analog-to-digital converter having a plurality of stages sharing an operational amplifier.

2. Description of the Related Art

A pipelined analog-to-digital converter converts an analog input signal to a digital output signal. Referring to FIG. 1, a block diagram of a conventional 10-bit pipelined analog-to-digital converter 100 is shown. The conventional 10-bit pipelined analog-to-digital converter 100 converts an analog input signal $V_{in}$ into a 10-bit digital output value $D_{out}$. In one embodiment, the pipelined analog-to-digital converter 100 comprises a sample and hold circuit 101, a first stage 102, a second stage 104, a third stage 106, a 4b flash circuit 107, and a digital correction module 108. The sample and hold circuit 101 samples and holds an analog input signal $V_{in}$ of the pipelined analog-to-digital converter 100. The sampled analog input signal is then delivered to the first stage 102.

The first stage 102, the second stage 104, and the third stage 106 are connected in series. Each stage receives a stage input signal from a prior stage, derives a stage output value and a residue from the stage input signal, and outputs the residue to a subsequent stage as the stage input signal of the subsequent stage. For example, the second stage 104 receives a residue from the first stage 102 as a stage input signal, and the third stage 106 receives a residue from the second stage 104 as a stage input signal. The 4b flash circuit 107 converts the residue of the third stage 106 to a residue. The digital correction module 108 then generates a digital output value $D_{out}$ according to the stage output values $D_1$, $D_2$, and $D_3$ of the first stage 102, the second stage 104, and the third stage 106 and the residue of the 4b flash circuit 107.

The three stages 102, 104, and 106 have the same circuit structure. Each of the stages 102, 104, and 106 comprises a multiplying digital-to-analog converter (MDAC) and a 2.5b sub ADC. Referring to FIG. 2A, a block diagram of a stage 102/104/106 of the conventional pipelined analog-to-digital converter 100 is shown. In one embodiment, the stage 102/104/106 comprises a MDAC 202 and a sub ADC 204. A stage input signal $V_{in}$ of the stage is sent to the sub ADC 204 and the MDAC 202. The sub ADC 204 converts the stage input signal $V_{in}$ from analog to digital to obtain a stage output value D. The MDAC 202 comprises a digital-to-analog converter (DAC) 212, a subtractor 214, and an amplifier 216. The DAC 212 converts the stage output value D from digital back to analog to obtain an analog signal D'. The subtractor 215 subtracts the analog signal D' from the stage input signal $V_{in}$ to obtain a difference signal. The amplifier 216 then amplifies the difference signal to obtain the residue $V_{res}$. The residue $V_{res}$ of the stage is then output to a subsequent stage as a stage input signal.

The function of the MDAC 202 is generally implemented with an operational amplifier. Referring to FIG. 2B, a circuit diagram of an operational amplifier 252 used by the stage is shown. A capacitor 254 alternately samples the stage input signal $V_{in}$ and the analog signal D', and a capacitor 256 is coupled between the negative input terminal and an output terminal of the operational amplifier 252 for amplifying the difference signal to obtain the residue $V_{res}$. The output terminal of the operational amplifier 252 outputs the residue $V_{res}$ of the stage.

As the conventional pipelined analog-to-digital converter 100 comprises three stages 102, 104, and 106, and each of the stages 102, 104, and 106 comprises a MDAC 112, 122, and 132, the conventional pipelined analog-to-digital converter 100 requires three operational amplifiers to implement the function of the MDAC 112, 122, and 132. The power consumption of an operational amplifier, however, is high, and three operational amplifiers for the three stages 102, 104, and 106 results in a large amount of power consumption for the conventional pipelined analog-to-digital amplifier 100, which degrades the performance of the conventional pipelined analog-to-digital amplifier 100. Thus, a pipelined analog-to-digital amplifier 100 with reduced power consumption is required.

BRIEF SUMMARY OF THE INVENTION

The invention provides a pipelined analog-to-digital converter. In one embodiment, the pipelined analog-to-digital converter comprises a first stage, a second stage, and a third stage. The first stage is arranged to derive a first stage output signal and a first residue from a first stage input signal. The second stage is arranged to derive a second stage output signal and a second residue from a second stage input signal, wherein the second stage input signal corresponds to the first residue. The third stage is arranged to derive a third stage output signal and a third residue from a third stage input signal, wherein the third stage input signal corresponds to the second residue. The first, second and third stages share an operational amplifier by utilizing at least three phases to control the operational amplifier.

The invention also provides a method for converting an analog signal into a digital signal. First, a first stage output signal and a first residue are derived from a first stage input signal, wherein the first stage input signal corresponds to the analog signal. A second stage output signal and a second residue are derived from a second stage input signal, wherein the second stage input signal corresponds to the first residue. A third stage output signal and a third residue are derived from a third stage input signal, wherein the third stage input signal corresponds to the second residue. The digital signal is then generated according to at least the first, second and third stage output signals. The derivation steps of the first stage output signal and the first residue, the second stage output signal and the second residue, and the third stage output signal and the third residue utilize a same operational amplifier having at least three phases.

The invention also provides a pipelined analog-to-digital converter. In one embodiment, the pipelined analog-to-digital converter comprises a first stage, a second stage, and a third stage. The first stage is arranged to derive a first stage output signal and a first residue according to a first stage input signal and a first clock phase. The second stage is arranged to derive a second stage output signal and a second residue according to a second stage input signal and a second clock phase, wherein the second stage input signal corresponds to the first residue. The third stage is arranged to derive a third stage output signal and a third residue according to a third stage input signal and a third clock phase, wherein the third stage input signal corresponds to the second residue. At least two of the first, second and third clock phases have different active periods.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 5A is a circuit diagram of an embodiment of an implementing circuit corresponding to a first stage of the pipelined analog-to-digital converter shown in FIG. 3;

FIG. 5B is a circuit diagram of an embodiment of an implementing circuit corresponding to a second stage of the pipelined analog-to-digital converter shown in FIG. 3;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
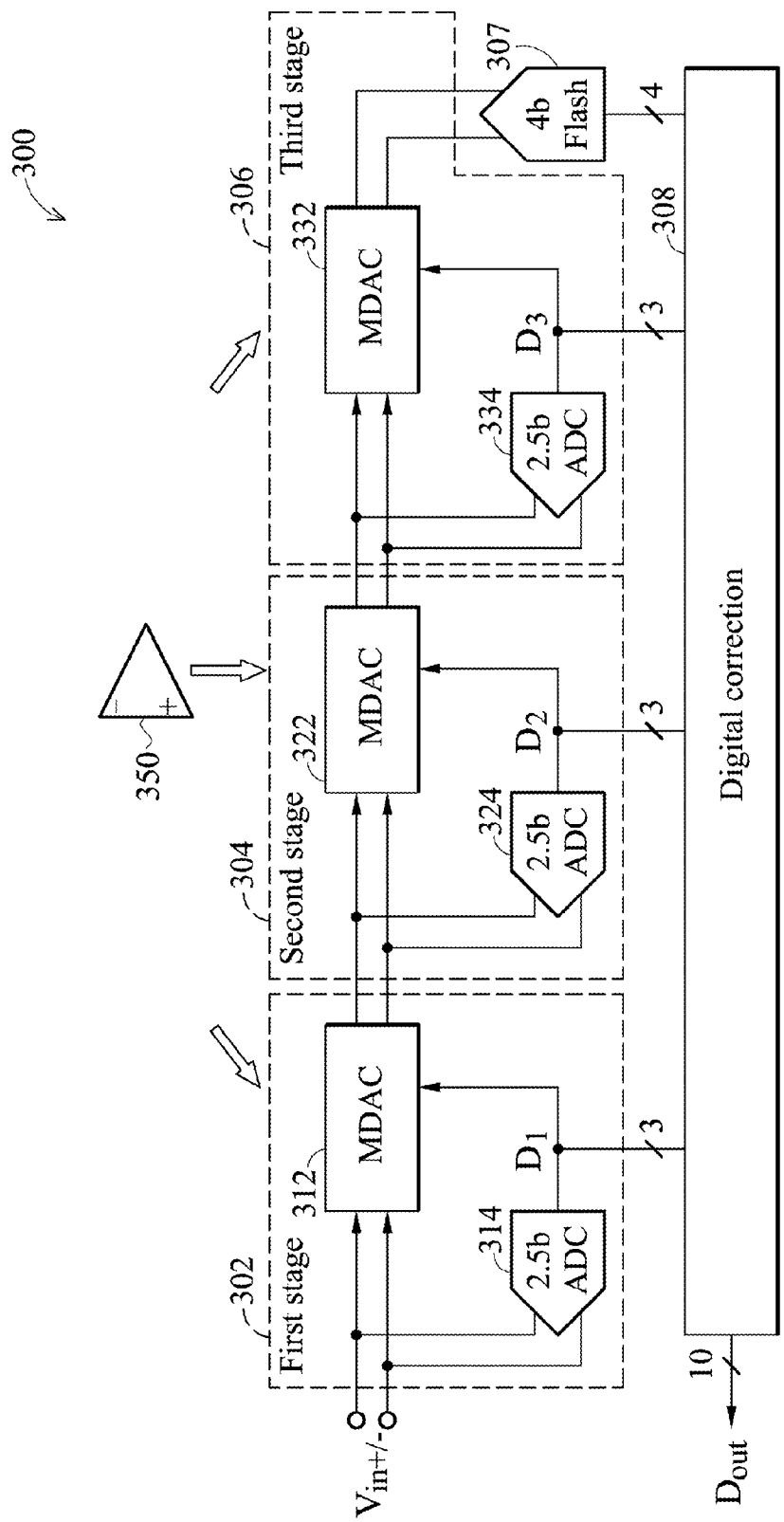
FIG. 3 is a block diagram of a pipelined analog-to-digital converter according to the invention.

Referring to FIG. 3, a block diagram of a pipelined analog-to-digital converter 300 according to an embodiment of the invention is shown. The pipelined analog-to-digital converter 300 converts an analog input $V_{in}$ to a digital output value $D_{out}$. In one embodiment, the pipelined analog-to-digital converter 300 comprises three stages 302, 304, and 306, a 4b flash circuit 307, and a digital correction module 308. The three stages 302, 304, and 306 are connected in series. Each stage receives a stage input signal from a prior stage, derives a stage output signal and a residue from the stage input signal, and outputs the residue to a subsequent stage as the stage input signal of the subsequent stage. For example, the second stage 304 receives a residue from the first stage 302 as a stage input signal, and the third stage 306 receives a residue from the second stage 304 as a stage input signal. The digital correction module 308 then generates a 10-bit digital output value $D_{out}$ according to the stage output values $D_1$, $D_2$, and $D_3$ of the first stage 302, the second stage 304, and the third stage 306 and the output of the 4b flash circuit 307.

Each of the stages 302, 304, and 306 comprises a multiplying analog-to-digital converter (MDAC) and a sub-ADC. Stage input signals of the stages 302, 304, and 306 are respectively sent to the 2.5b sub ADCs 314, 324, and 334 and the MDACs 312, 322, and 332. The 2.5b sub ADCs 314, 324, and 334 respectively convert the stage input signals from analog to digital to obtain stage output signals $D_1$, $D_2$, and $D_3$ output to the digital correction module 308. The MDACs 312, 322 and 332 respectively convert the stage output signals $D_1$, $D_2$, and $D_3$ generated by the 2.5b sub ADCs 314, 324, and 334 from digital back to analog to obtain analog signals, subtract the analog signals from corresponding stage input signals to obtain difference signals, and then amplify the difference signals to obtain residues output to a subsequent stage.

Figure 1:
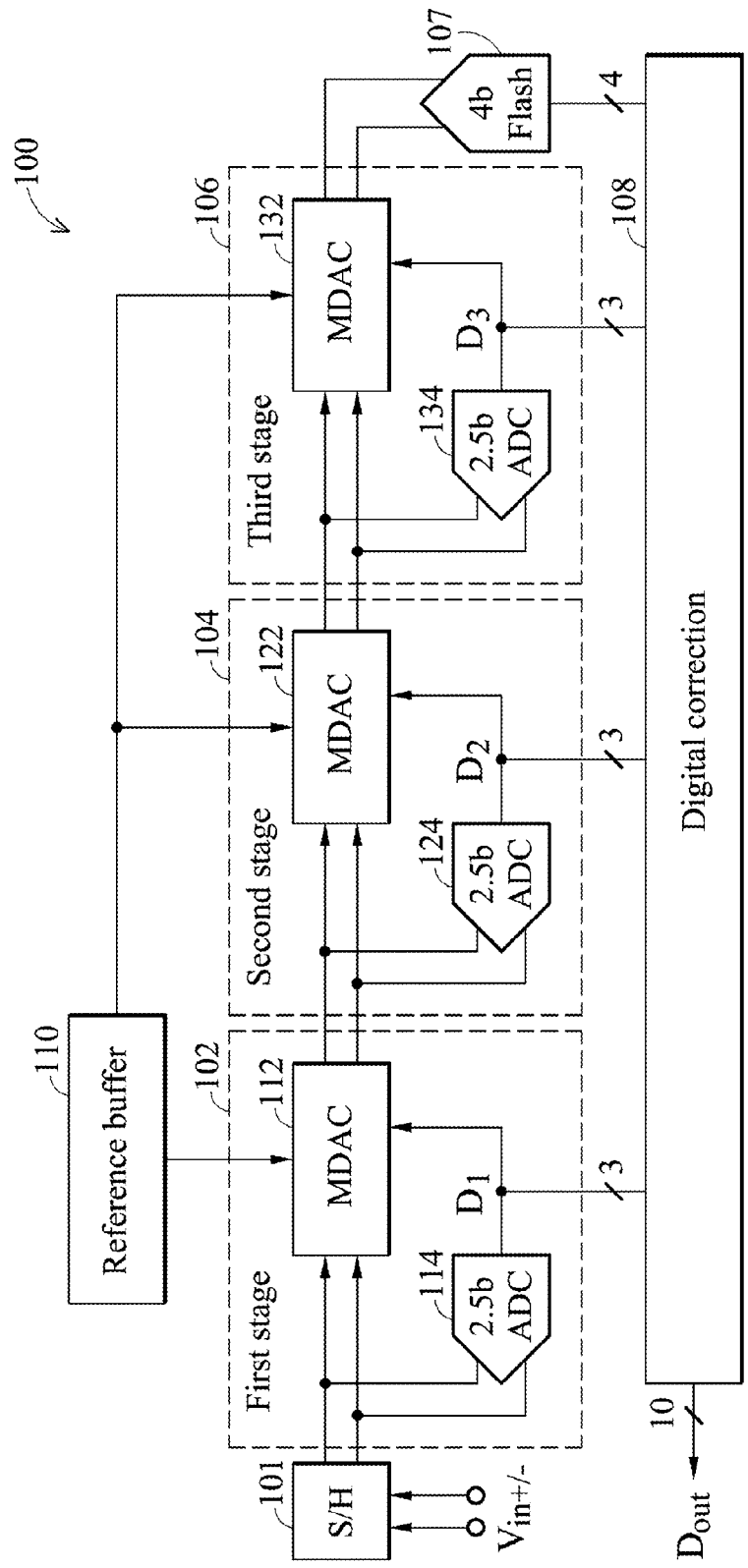
FIG. 1 is a block diagram of a conventional 10-bit pipelined analog-to-digital converter.
Figures 2A, 2B:
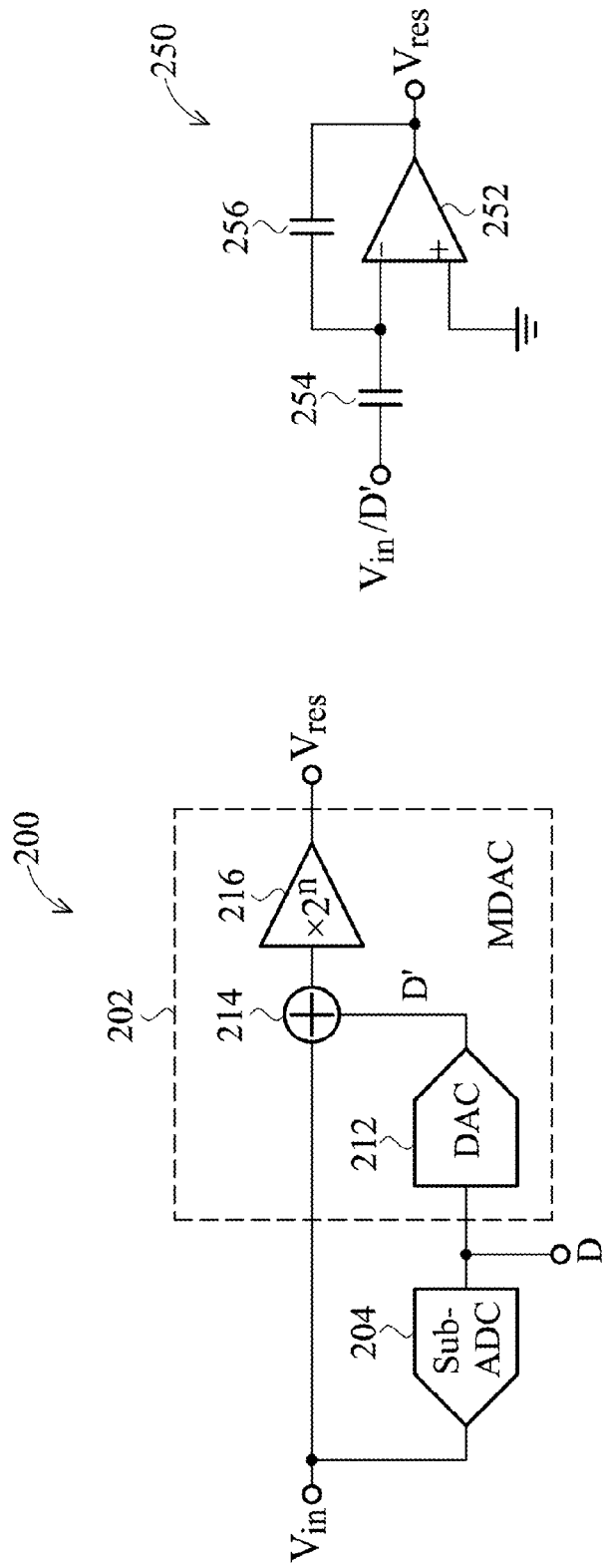
FIG. 2A is a block diagram of a stage of a conventional pipelined analog-to-digital converter.
FIG. 2B is a circuit diagram of an operational amplifier used by a stage.

The MDACs 312, 322, and 332 of the stages 302, 304, and 306 share one operational amplifier 350. In other words, the pipelined analog-to-digital converter 300 uses only one operational amplifier 350 to implement the functions of the three multiplying analog-to-digital converters 312, 322, and 332. First, an operation of the MDACs 312, 322, and 332 can be divided into a sampling phase and an evaluation phase. In the sampling phase, the voltage of the stage input signal and the voltage of the stage output signal are alternately applied to an auxiliary capacitor of the operational amplifier 350. In the evaluation phase, the operational amplifier 350 used by the stage senses and amplifies the difference between the voltage of the stage input signal and the voltage of the stage output signal from the auxiliary capacitor to generate an output voltage as a residue of the stage. The operations of the sampling phase and evaluation phase are similar to that shown with FIG. 2B. In this embodiment, however, because the operational amplifier 350 does not physically operate in a sampling phase of the stage, the operational amplifier 350 is switched to another stage to perform the evaluation for the another stage. For example, after the MDAC 312 performs the evaluation (i.e., obtains the residue of the first stage 302), the operational amplifier 350 is de-coupled from the capacitors within the MDAC 312 and is switched to be coupled to the capacitors in MDAC 322 to perform the evaluation for the second stage 304. Meanwhile, the first stage 302 enters its sampling phase. Similarly, after the MDAC 322 performs the evaluation (i.e., obtains the residue of the second stage 304), the operational amplifier 350 is de-coupled from the capacitors within the MDAC 322 and is switched to be coupled to the capacitors in MDAC 332 to perform the evaluation for the third stage 306. Meanwhile, the second stage 304 enters its sampling phase. Further after the MDAC 332 performs the evaluation (i.e., obtains the residue of the third stage 306), the operational amplifier 350 is de-coupled from the capacitors within the MDAC 332 and is switched to be coupled to the capacitors in MDAC 312 to perform the evaluation for the first stage 302. Meanwhile, the third stage 306 enters its sampling phase. This can be done by controlling the three stages 302-306 with three different clock signals and setting the periods of the three clock signals properly. Thus, the three stages 302, 304, and 306 can use the operational amplifier 350 in an alternate way, wherein only one of the stages 302, 304, and 306 is in an evaluation phase at a time.

Figure 4:
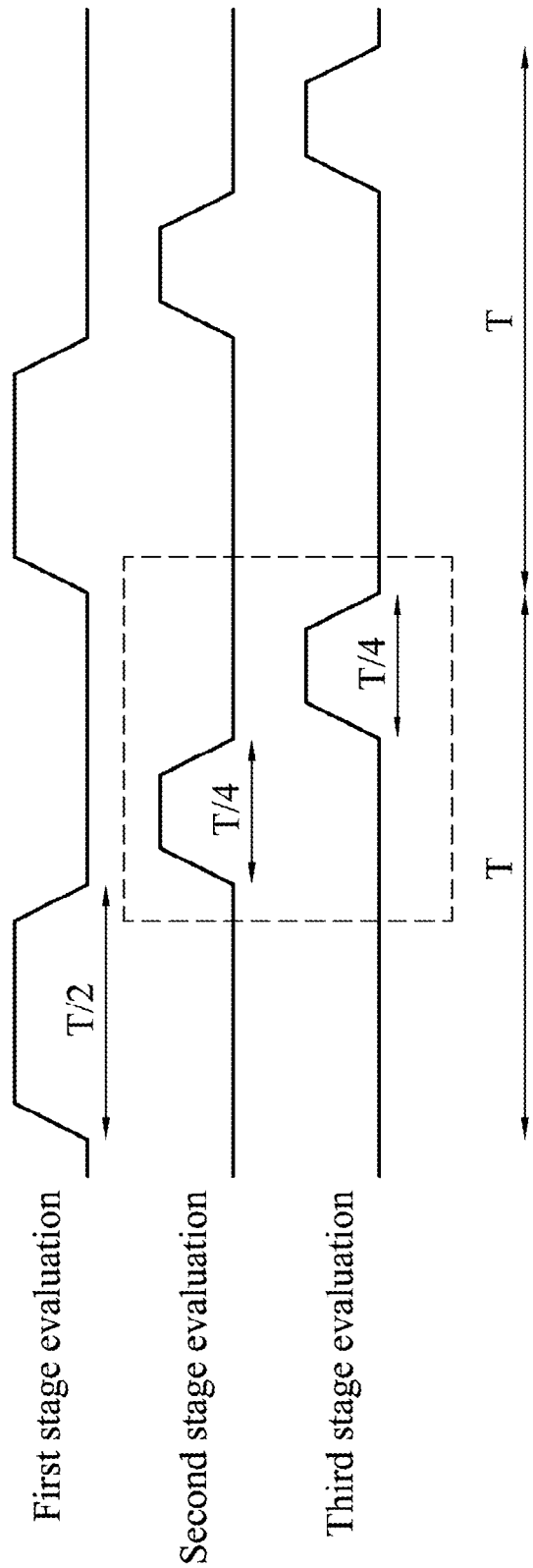
FIG. 4 is a schematic diagram of timings for three stages of the pipelined analog-to-digital converter shown in FIG. 3 when sharing an operational amplifier according to the invention.

FIG. 4 shows an example of the three clock signals utilized to switch the operational amplifier 350. Because the resolution of the residue of the first stage 302 is higher than those of the second and third stages 304 and 306, the active period of the first clock signal is longer than the active periods of the second and third clock signals, meaning that the evaluation time for the first stage 302 is longer than the evaluation times of the next two stages 304 and 306. In this embodiment, the active periods of the second and third clock signals (i.e., the second and third phases of the operational amplifier 350) is substantially half of the active period of the first clock signal (i.e., the first phase of the operational amplifier 350). More specifically, during the time period 0~T/2, the MDAC 312 of the first stage 302 uses the operational amplifier 350 to generate a residue; during the time period T/2~3T/4, the MDAC 322 of the second stage 304 uses the operational amplifier 350 to generate a residue; during the time period 3T/4~T, the MDAC 332 of the third stage 306 uses the operational amplifier 350 to generate a residue; during the time period T-3T/2, the MDAC 312 of the first stage 302 uses the operational amplifier 350 to generate a residue, and so on. Because the pipelined analog-to-digital converter 300 merely uses one operational amplifier 350 to convert the analog input signal $V_{in}$ to a 10-bit digital output value $D_{out}$, the static current, power consumption and circuit area of the pipelined analog-to-digital converter 300 is significantly reduced as compared with the conventional pipelined analog-to-digital converter 100.

The evaluation times of the three MDACs can be properly set by referring to the following equations:

$$g_m \geq (C_L/T_S) \times n \times \ln 2 \quad (1),$$

wherein $g_m$ is the transconductance of the operational amplifier 350, $C_L$ is loading capacitance corresponding to the MDAC, $T_s$ is setting time of the MDAC, which is the shortest time period required by the operational amplifier to output a residue with a required resolution, and n is resolution of the residue of the stage. From equation (1), equation (2) is derived:

$$T_{s1}/T_{s2} = n_1 * C_{L1}/n_2 * C_{L2} \quad (2),$$

wherein $T_{s1}$ is the setting time of the MDAC 312, $T_{s2}$ is the setting time of the MDAC 322, $n_1$ is the resolution of the first residue, $C_{L1}$ is the loading capacitance corresponding to the MDAC 312, $n_2$ is the resolution of the second residue, $C_{L2}$ is the loading capacitance corresponding to the MDAC 322. The setting time $T_{S1}$, $T_{S2}$, and $T_{S3}$ of the MDACs 312, 322, and 332 is therefore in proportion to the products $C_{L1} \times n_1$, $C_{L2} \times n_2$, and $C_{L3} \times n_3$ of the resolution and loading capacitance of the first, second, and third stages 302, 304, and 306.

Referring to FIG. 5A, a circuit diagram of an embodiment implementing the evaluation phase of the MDAC 312 of the pipelined analog-to-digital converter 300 is shown. The circuit 500 comprises two capacitors 501 and 502 and an operational amplifier 350. The capacitor 501 coupled between a stage input signal Vin and a negative input terminal of the operational amplifier 350 has capacitance 3C. The capacitor 502 coupled between the negative input terminal and an output terminal of the operational amplifier 350 has capacitance C. A sampling capacitance resulting from a combination of the capacitors 551 and 552 of the second stage shown in FIG. 5B is equal to C. The total loading capacitance $C_{L1}$ of the circuit 500 corresponding to the first stage 302 is therefore equal to 1.75C.

Referring to FIG. 5B, a circuit diagram of an embodiment implementing the evaluation phase of the MDAC 322 of the pipelined analog-to-digital converter 300 is shown. The circuit 550 comprises two capacitors 551 and 552 and an operational amplifier 350. The capacitor 551 coupled between a stage input signal $V_{in}$ and a negative input terminal of the operational amplifier 350 has capacitance 0.75C. The capacitor 552 coupled between the negative input terminal and an output terminal of the operational amplifier 350 has capacitance 0.25C. A sampling capacitance resulting from the third stage is less than or equal to 0.8C. The total loading capacitance of the circuit 550 corresponding to the second stage 304 is therefore equal to 0.9875C. Because the setting time $T_{S1}$ and $T_{S2}$ of the first and second stages 302 and 304 is in proportion to the products $C_{L1} \times m$ and $C_{L2} \times n_2$ of the resolution and loading capacitance of the first and second stages 302 and 304, the ratio $T_{S1}/T_{S2}$ of setting time of the first and second stages 302 and 304 is therefore equal to $[(C_{L1} \times m)/(C_{L2} \times n_2)] = [(1.75C \times 9)/(0.9875C \times 7)] = 2.3$. Thus, the setting time $T_{S1}$ of the first stage 302 is roughly 2 times that of the setting time $T_{S2}$ of the second stage 304. With proper selected capacitance, the overall conversion accuracy does not degrade even the evaluation time of the second and third stage is shortened.

Figure 6A:
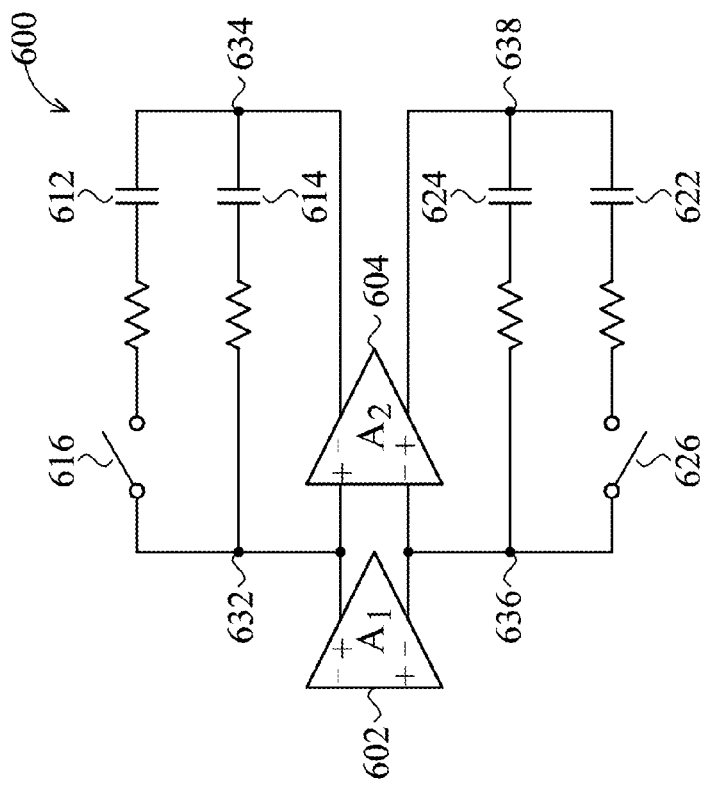
FIG. 6A is a circuit diagram of a two-stage operational amplifier according to the invention.
Figure 7B:
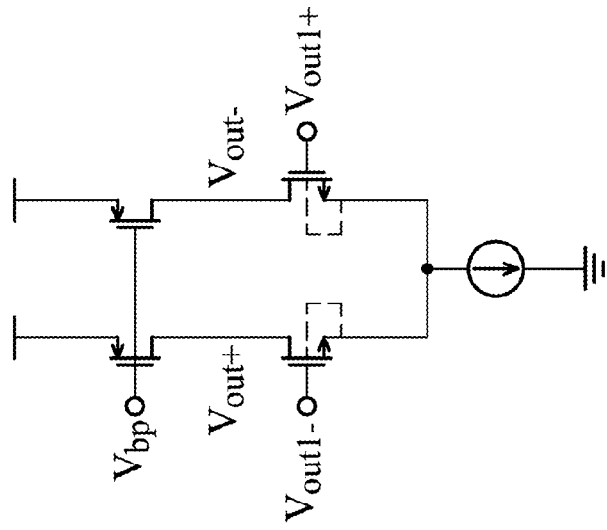
FIG. 7B shows an embodiment of circuit of a second-stage operational amplifier of the two-stage operational amplifier shown in FIG. 6A.
Figure 7A:
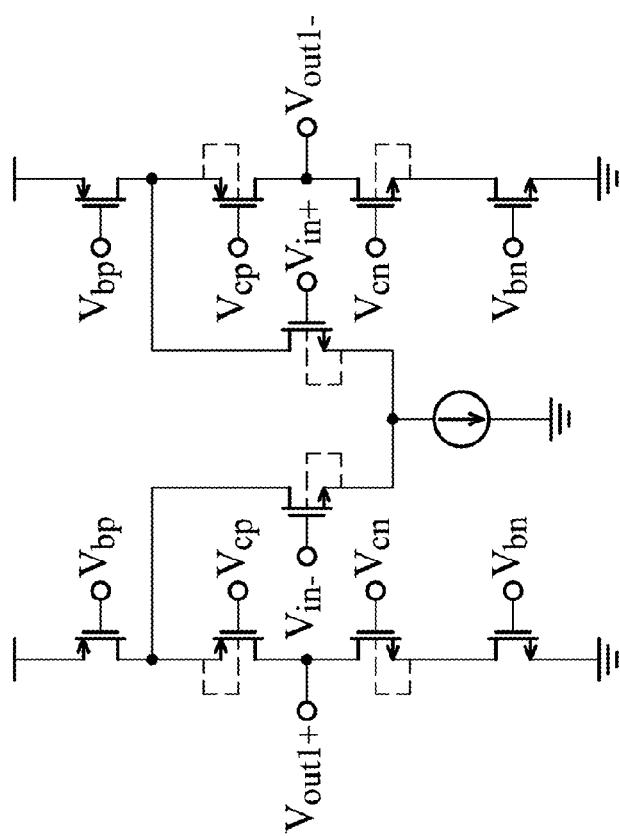
FIG. 7A shows an embodiment of circuit of a first-stage operational amplifier of the two-stage operational amplifier shown in FIG. 6A.

In one embodiment, the operational amplifier 350 shared by the stages 302, 304, and 306 is a two-stage operational amplifier. Referring to FIG. 6A, a circuit diagram of a two-stage operational amplifier 600 according to the invention is shown. The two-stage operational amplifier 600 comprises a first-stage operational amplifier 602 and a second-stage operational amplifier 604. FIGS. 7A and 7B respectively show embodiments of circuits of the first-stage operational amplifier 602 and the second-stage operational amplifier 604. A positive output terminal of the first stage operational amplifier 602 is coupled to the positive input terminal of the second stage operational amplifier 604, and a negative output terminal of the first stage operational amplifier 602 is coupled to the negative input terminal of the second stage operational amplifier 604. A compensation capacitor 614 is coupled between the positive input terminal and the negative output terminal of the second stage operational amplifier 604, and a compensation capacitor 624 is coupled between the negative input terminal and the positive output terminal of the second stage operational amplifier 604, wherein the compensation capacitor 614 has the same capacitance as that of the compensation capacitor 624. A switch 616 and a compensation capacitor 612 are coupled between the positive input terminal and the negative output terminal of the second stage operational amplifier 604, and a switch 626 and a compensation capacitor 622 are coupled between the negative input terminal and the positive output terminal of the second stage operational amplifier 604, wherein the compensation capacitor 612 has the same capacitance as that of the compensation capacitor 622.

Figure 6B:
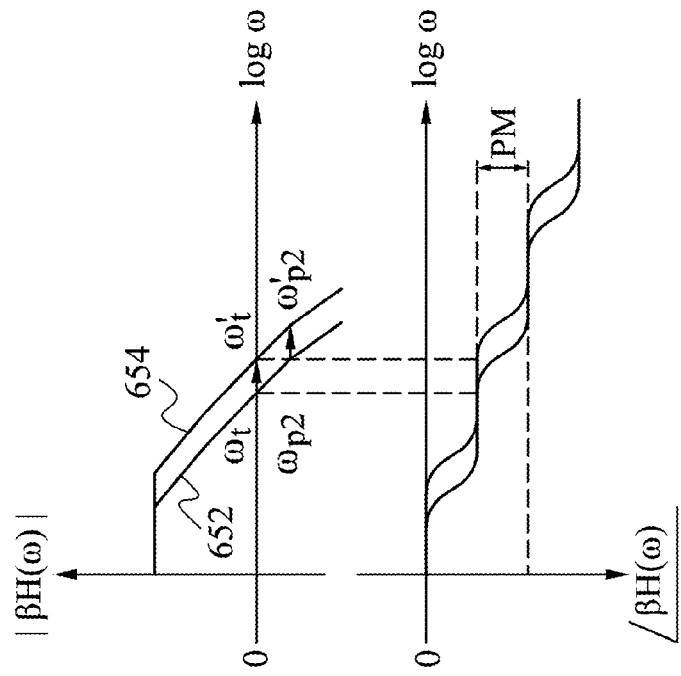
FIG. 6B is a Bode plot of the two-stage operational amplifier shown in FIG. 6A according to the invention.

Referring to FIG. 6B, a Bode plot of the two-stage operational amplifier 600 according to the invention is shown. In the Bode gain plot, the line 652 corresponds to a magnitude of the frequency response of the two-stage operational amplifier 600 used by the first stage 302, and the line 654 corresponds to a magnitude of the frequency response of the two-stage operational amplifier 600 used by the second stage 304. The frequency $\omega_t$ is a cut-off frequency of the operational amplifier 600 corresponding to the first stage 302, and the frequency $\omega_{p2}$ is a pole frequency of the amplifier 600 corresponding to the first stage 302. The frequency $\omega_t'$ is a cut-off frequency of the operational amplifier 600 corresponding to the second stage 304, and the frequency $\omega_{p2}'$ is a pole frequency of the amplifier 600 corresponding to the second stage 304.

To keep the 2-stage operational amplifier 600 stable when a stage using the 2-stage operational amplifier 600 is switched from the first stage 302 to the second stage 304, the phase margin between the frequency $\omega_t$ and the frequency $\omega_{p2}$ corresponding to the first stage 302 should be equal to the phase margin between the frequency $\omega_t'$ and the frequency $\omega_{p2}'$ corresponding to the first stage 302. Thus, the following equations are obtained:

$$PM = 90° - \tan^{-1}\frac{\omega_t'}{\omega_{p2}'} = 90° - \tan^{-1}\frac{\omega_t}{\omega_{p2}};$$

$$\frac{\omega_t'}{\omega_{p2}'} = \frac{\omega_t}{\omega_{p2}};$$

$$\frac{g_{m1}/C_{c1}'}{g_{m2}/C_{L1}'} = \frac{g_{m1}/C_{c1}}{g_{m2}/C_{L1}}; \text{ and}$$

$$\frac{C_{L1}'}{C_{c1}'} = \frac{C_{L1}}{C_{c1}},$$

wherein $g_{m1}$ is the transconductance of the first stage operational amplifier 602, $g_{m2}$ is the transconductance of the second stage operational amplifier 604, $C_{c1}$ is total compensation capacitance corresponding to the first stage 302, $C_{c2}$ is total compensation capacitance corresponding to the second stage 304, $C_{L1}$ is total loading capacitance corresponding to the first stage 302, and $C_{L2}$ is total loading capacitance corresponding to the second stage 302.

Thus, to keep the ratio of the total compensation capacitance to the total loading capacitance unchanged, the compensation capacitance of the two-stage operational amplifier 600 is adjusted according to the loading capacitance of a stage using the two-stage operational amplifier 600; thereby stabilizing the 2-stage operational amplifier 600 when a stage using the 2-stage operational amplifier 600 is switched from the first stage 302 to the second stage 304. For example, the total loading capacitance $C_{L1}$ corresponding to the first stage 302 is greater than the total loading capacitance $C_{L2}$ corresponding to the second stage 304. When the two-stage operational amplifier 600 is used by the first stage 302, the switches 616 and 626 are therefore closed to increase the total compensation capacitance $C_{c1}$ of the two-stage operational amplifier 600. When the two-stage operational amplifier 600 is used by the second stage 304, the switches 616 and 626 are therefore opened to decrease the total compensation capacitance $C_{c2}$ of the two-stage operational amplifier 600.

Figure 8:
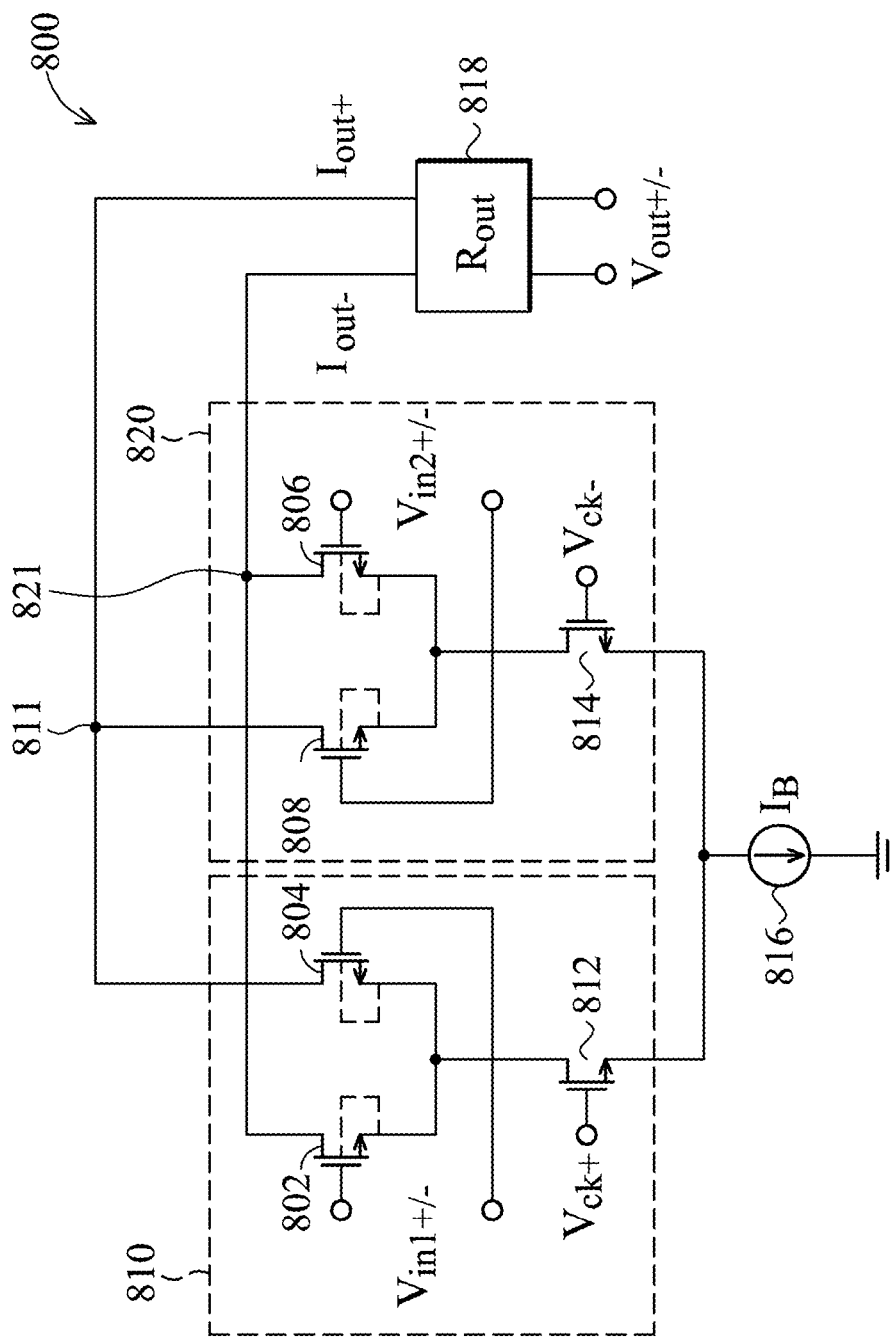
FIG. 8 is a circuit diagram of a portion of an operational amplifier with two input terminal pairs according to the invention.

When the stage using the operational amplifier 350 is changed from a prior stage to a subsequent stage, the charges left on the input terminal of the operational amplifier 350 by the prior stage will affect the operation of the operational amplifier 350 used by the subsequent stage, of which, the phenomenon is referred to as a memory effect. To prevent memory effect, an operational amplifier 350 with a plurality of input terminal pairs is therefore devised, wherein at least two of the stages 302, 304, and 306 use different input circuits to input the stage input signal to the operational amplifier. Referring to FIG. 8, a circuit diagram of a portion of an operational amplifier 800 with two input terminal pairs according to the invention is shown. The operational amplifier 800 comprises two input circuits 810 and 820, a current source 816, and an output resistor 818. The input circuit 810 comprises two input terminal pairs $V_{in1+/-}$ and $V_{in2+/-}$. The first input terminal pair $V_{in1+/-}$ is active during the MDAC conversions of the first stage 302 and the second stage 304, and the second input terminal pair $V_{in2+/-}$ is active only during the MDAC conversion of the third stage 306. The input terminal pair $V_{in1+/-}$ is for receiving stage input signals of the first stage 302 and the second stage 304. In one embodiment, the input circuit 810 comprises NMOS transistors 802, 804, and 812. The NMOS transistor 802 has a gate coupled to a positive input terminal $V_{in1+}$ corresponding to the first stage 302 and the second stage 304, a source coupled to the drain of the NMOS transistor 812, and a drain coupled to an input node 821 of the output resistor 818. The NMOS transistor 804 has a gate coupled to a negative input terminal $V_{in1-}$ corresponding to the first stage 302 and the second stage 304, a source coupled to the drain of the NMOS transistor 812, and a drain coupled to an input node 811 of the output resistor 818. The NMOS transistor 812 has a gate coupled to a selection signal $V_{ck+}$ corresponding to the first stage 302 and the second stage 304 and a source coupled to the current source $I_B$.

The input terminal pair $V_{in2+/-}$ is for receiving a stage input signal of the third stage 306. In one embodiment, the input circuit 820 comprises NMOS transistors 808, 806, and 814. The NMOS transistor 806 has a gate coupled to a positive input terminal $V_{in2+}$ corresponding to the third stage 306, a source coupled to the drain of the NMOS transistor 814, and a drain coupled to the input node 821 of the output resistor 818. The NMOS transistor 808 has a gate coupled to a negative input terminal $V_{in2-}$ corresponding to the third stage 306, a source coupled to the drain of the NMOS transistor 814, and a drain coupled to the input node 811 of the output resistor 818. The NMOS transistor 814 has a gate coupled to a selection signal $V_{ck-}$ corresponding to the third stage 306 and a source coupled to the current source $I_B$.

Figure 9:
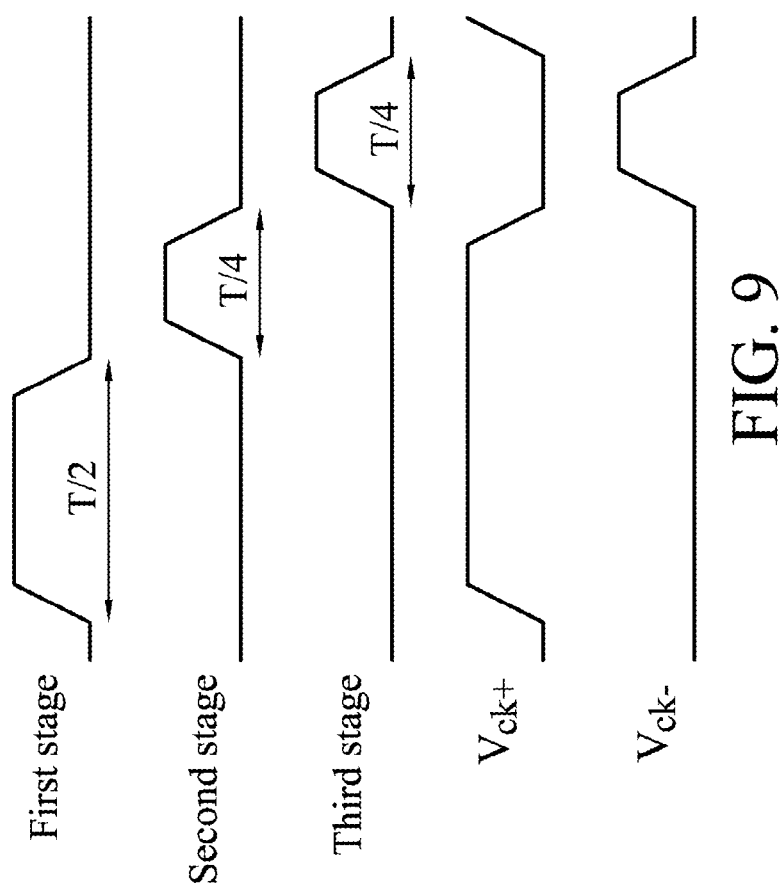
FIG. 9 is a schematic diagram of selection signals of input circuits of the operational amplifier shown in FIG. 8 according to the invention.

Referring to FIG. 9, a schematic diagram of selection signals $V_{ck+}$ and $V_{ck-}$ of the input circuits 810 and 820 of the operational amplifier 800 according to the invention is shown. When the first stage 302 or the second stage 304 uses the operational amplifier 800, the selection signal $V_{ck+}$ is enabled, so that the NMOS transistor 812 is therefore turned on to make the current $I_B$ of the current source 816 flow through the input transistors 802 and 804, and the stage input signal of the first stage 302 or the second stage 304 across the input terminal pair $V_{in1+/-}$ is converted to current signals $I_{out+}$ and $I_{out-}$ flowing through the output resistor 818. When the third stage 306 uses the operational amplifier 800, the selection signal $V_{ck-}$ is enabled, so that the NMOS transistor 814 is therefore turned on to make the current $I_B$ of the current source 816 flow through the input transistors 806 and 808, and the stage input signal of the third stage 306 across the input terminal pair $V_{in2+/-}$ is converted to current signals $I_{out+}$ and $I_{out-}$ flowing through the output resistor 818. Because the first stage 302 and the third stage 306 does not use the same input terminal pair, the stage residual voltage of the stage 306 does not affect the stage input voltage of the first stage 302, and memory effect is therefore prevented.

A person with ordinary skill in the art should appreciate that the present invention is not limit to three stages pipelined ADC. The operational amplifier sharing technique mentioned above can be extended to the pipelined ADC having more than three stages. As long as at least three MDAC stage in a pipelined ADC share one operational amplifier, it should fall within the scope of the present invention.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pipelined analog-to-digital converter, comprising:
a first stage, arranged to derive a first stage output signal and a first residue from a first stage input signal;

a second stage, arranged to derive a second stage output signal and a second residue from a second stage input signal, wherein the second stage input signal corresponds to the first residue; and a third stage, arranged to derive a third stage output signal and a third residue from a third stage input signal, wherein the third stage input signal corresponds to the second residue;

wherein the first, second and third stages share an operational amplifier by utilizing at least three phases to control the operational amplifier, wherein the operational amplifier implements a function of a multiplying analog-to-digital converter.

2. The pipelined analog-to-digital converter as claimed in claim 1, wherein each of the first, second and third stages comprises:

a sub analog-to-digital converter, arranged to convert the corresponding stage input signal to the corresponding stage output signal; and a multiplying digital-to-analog converter, arranged to convert the corresponding stage output signal from digital to analog to obtain an analog signal, to subtract the analog signal from the corresponding stage input signal to obtain a difference signal, and to amplify the difference signal to obtain the corresponding residue;

wherein the first, second and third stages share the operational amplifier to perform the amplify step to obtain the corresponding residue.

3. The pipelined analog-to-digital converter as claimed in claim 2, wherein when the operational amplifier operates in a first phase, the operational amplifier is configured to amplify the difference signal of the first stage to obtain the first residue signal, when the operational amplifier operates in a second phase, the operational amplifier is configured to amplify the difference signal of the second stage to obtain the second residue signal, when the operational amplifier operates in a third phase, the operational amplifier is configured to amplify the difference signal of the third stage to obtain the third residue, and the first phase has a longer active period than the second and third phases.

4. The pipelined analog-to-digital converter as claimed in claim 3, wherein the active periods of the second and the third phases for using the operational amplifier are both substantially equal to a half of the active period of the first phase.

5. The pipelined analog-to-digital converter as claimed in claim 1, wherein when the operational amplifier operates in a first phase, the operational amplifier is configured to the first stage, when the operational amplifier operates in a second phase, the operational amplifier is configured to the second stage, and when the operational amplifier operates in a third phase, the operational amplifier is configured to the third stage; wherein the first phase has a longer active period than the second and third phases.

6. The pipelined analog-to-digital converter as claimed in claim 5, wherein the active periods of the second and the third phases for using the operational amplifier are substantially equal to a half of the active period of the first phase.

7. The pipelined analog-to-digital converter as claimed in claim 1, wherein when the operational amplifier is used by the first stage, a first capacitor is coupled between the stage input signal of the first stage and a negative input terminal of the operational amplifier, and a second capacitor is coupled between the negative input terminal and an output terminal of the operational amplifier, and when the operational amplifier is used by the second stage, a third capacitor is coupled between the stage input signal of the second stage and the negative input terminal of the operational amplifier, and a fourth capacitor is coupled between the negative input terminal and the output terminal of the operational amplifier, wherein a ratio of the capacitance of the first capacitor, the second capacitor, the third capacitor, and the fourth capacitor is substantially 3:1:0.75:0.25.

8. The pipelined analog-to-digital converter as claimed in claim 1, wherein the operational amplifier comprises:

a first-stage operational amplifier, having a positive output terminal and a negative output terminal;

a second-stage operational amplifier, having a positive input terminal, a negative input terminal, a positive output terminal and a negative output terminal, wherein the positive input terminal is coupled to the positive output terminal of the first-stage operational amplifier, and the negative input terminal is coupled to the negative output terminal of the first-stage operational amplifier;

a first compensation capacitor, coupled between the positive input terminal and the negative output terminal of the second-stage operational amplifier; and a second compensation capacitor, coupled between the negative input terminal and the positive output terminal of the second-stage operational amplifier, wherein the capacitance of the first compensation capacitor and the capacitance of the second compensation capacitor are proportional to the capacitance of a loading capacitor of the operational amplifier.

9. The pipelined analog-to-digital converter as claimed in claim 1, wherein the operational amplifier has a plurality of input circuits, and at least two of the stages use different input circuits to input the stage input signal to the operational amplifier, to prevent a memory effect.

10. The pipelined analog-to-digital converter as claimed in claim 9, wherein each of the input circuits comprises:

a first transistor, having a control terminal utilized as a positive input terminal of the input circuit, a first terminal utilized as a positive output terminal of the input circuit, and a second terminal;

a second transistor, having a control terminal utilized as a negative input terminal of the input circuit, a first terminal utilized as a negative output terminal of the input circuit, and a second terminal coupled the second terminal of the first transistor; and a third transistor, having a first terminal coupled to the second terminal of the first transistor, a second terminal coupled to a current source, and a control terminal coupled to a selection signal.

11. A method for converting an analog signal into a digital signal, comprising:

(a) deriving a first stage output signal and a first residue from a first stage input signal, wherein the first stage input signal corresponds to the analog signal;

(b) deriving a second stage output signal and a second residue from a second stage input signal, wherein the second stage input signal corresponds to the first residue;

(c) deriving a third stage output signal and a third residue from a third stage input signal, wherein the third stage input signal corresponds to the second residue; and (d) generating the digital signal according to at least the first, second and third stage output signals;

wherein steps (a)-(c) utilize a same operational amplifier having at least three phases, wherein the operational amplifier implements a function of a multiplying analog-to-digital converter.

12. The method as claimed in claim 11, wherein each of the steps (a)-(c) comprises:

converting the corresponding stage input signal to the corresponding stage output signal; and converting the corresponding stage output signal from digital to analog to obtain an analog signal, subtracting the analog signal from the corresponding stage input signal to obtain a difference signal, and amplifying the difference signal to obtain the corresponding residue;

wherein steps (a)-(c) utilize the same operational amplifier to perform the amplifying to obtain the corresponding residue.

13. The method as claimed in claim 11, wherein the operational amplifier operates in a first phase for step (a), operates in a second phase for step (b), operates in a third phase for step (c), and the first phase has a longer active period than the second and third phases.

14. The method as claimed in claim 13, wherein the active periods of the second and third phases are substantially equal to a half of the active period of the first phase.

15. The method as claimed in claim 11, wherein step (a) comprises coupling a first capacitor between the first stage input signal and a negative input terminal of the operational amplifier, and coupling a second capacitor between the negative input terminal and an output terminal of the operational amplifier; step (b) comprises coupling a third capacitor between the second stage input signal and the negative input terminal of the operational amplifier, and coupling a fourth capacitor between the negative input terminal and the output terminal of the operational amplifier, wherein a ratio of the capacitance of the first capacitor, the second capacitor, the third capacitor, and the fourth capacitor is substantially 3:1:0.75:0.25.

16. The method as claimed in claim 11, wherein the operational amplifier has a plurality of input circuits, and the step (a) comprises receiving the first stage input signal through an input circuit of the plurality of input circuits, and step (b) or step (c) comprises receiving the second or third stage input signal through another input circuit of the plurality of input circuits.

17. A pipelined analog-to-digital converter, comprising:

a first stage, arranged to derive a first stage output signal and a first residue according to a first stage input signal and a first clock phase;

a second stage, arranged to derive a second stage output signal and a second residue according to a second stage input signal and a second clock phase, wherein the second stage input signal corresponds to the first residue; and a third stage, arranged to derive a third stage output signal and a third residue according to a third stage input signal and a third clock phase, wherein the third stage input signal corresponds to the second residue;

wherein at least two of the first, second and third clock phases have different active periods.

* * * * *